(12) United States Patent
Drane

(10) Patent No.: US 11,836,460 B2
(45) Date of Patent: *Dec. 5, 2023

(54) ERROR BOUNDED MULTIPLICATION BY INVARIANT RATIONALS

(71) Applicant: Imagination Technologies Limited, Kings Langley (GB)

(72) Inventor: Theo Alan Drane, London (GB)

(73) Assignee: Imagination Technologies Limited, Kings Langley (GB)

( * ) Notice: Subject to any disclaimer, the term of this patent is extended or adjusted under 35 U.S.C. 154(b) by 172 days.

This patent is subject to a terminal disclaimer.

(21) Appl. No.: 17/171,174

(22) Filed: Feb. 9, 2021

(65) Prior Publication Data

US 2021/0165634 A1 Jun. 3, 2021

Related U.S. Application Data

(63) Continuation of application No. 16/796,786, filed on Feb. 20, 2020, now Pat. No. 10,949,167, which is a (Continued)

(30) Foreign Application Priority Data

Jun. 27, 2016 (GB) ...................................... 1611156

(51) Int. Cl.
*G06F 7/535* (2006.01)
*G06F 30/327* (2020.01)
(Continued)

(52) U.S. Cl.
CPC ................ *G06F 7/523* (2013.01); *G06F 7/38* (2013.01); *G06F 7/535* (2013.01); *G06F 30/327* (2020.01);
(Continued)

(58) Field of Classification Search
CPC . G06F 7/523; G06F 7/535; G06F 7/38; G06F 2207/5356; G06F 30/327
See application file for complete search history.

(56) References Cited

U.S. PATENT DOCUMENTS 8,046,401 B2   10/2011  Pu et al.
2004/0267681 A1  12/2004  Savage
(Continued)

OTHER PUBLICATIONS

Hsiao et al., "Low-Cost FIR Filter Designs Based on Faithfully Rounded Truncated Multiple Constant Multiplication/Accumulation," IEEE Transactions on Circuits and Systems II: Express Briefs, IEEE, vol. 60, No. 5, May 1, 2013, pp. 287-291.
(Continued)

*Primary Examiner* — Matthew D Sandifer
(74) *Attorney, Agent, or Firm* — Potomac Law Group, PLLC; Vincent M DeLuca

(57) ABSTRACT

A hardware logic representation of a circuit to implement an operation to perform multiplication by an invariant rational is generated by truncating an infinite single summation array (which is represented in a finite way). The truncation is performed by identifying a repeating section and then discarding all but a finite number of the repeating sections whilst still satisfying a defined error bound. To further reduce the size of the summation array, the binary representation of the invariant rational is converted into canonical signed digit notation prior to creating the finite representation of the infinite array.

13 Claims, 8 Drawing Sheets

Related U.S. Application Data continuation of application No. 16/388,177, filed on Apr. 18, 2019, now Pat. No. 10,606,558, which is a continuation of application No. 15/633,883, filed on Jun. 27, 2017, now Pat. No. 10,310,816.

(51) Int. Cl.
  *G06F 30/34* (2020.01)
  *G06F 7/523* (2006.01)
  *G06F 7/38* (2006.01)

(52) U.S. Cl.
  CPC ...... *G06F 30/34* (2020.01); *G06F 2207/5356* (2013.01)

(56) References Cited

U.S. PATENT DOCUMENTS

| | | |
|---|---|---|
| 2011/0264990 A1 | 10/2011 | Sawada |
| 2013/0007085 A1 | 1/2013 | Drane |
| 2013/0103733 A1 | 4/2013 | Drane et al. |
| 2013/0152030 A1 | 6/2013 | Drane et al. |
| 2013/0346927 A1 | 12/2013 | Drane et al. |
| 2014/0280410 A1 | 9/2014 | Rose |
| 2016/0097808 A1 | 4/2016 | Drane |

OTHER PUBLICATIONS

Drane, "Lossy Polynomial Datapath Synthesis," Imperial College London Department of Electrical and Electronic Engineering, Feb. 1, 2014, retrieved from the Internet: URL:https://spiral.imperial.ac.uk/bitstream/10044/1/15566/5.

DeBrunner et al., "Using Variable Length 13-ary, Radix-4 CSC Coefficients to Achieve Low-Area Implementations of FIR Filters," 2002 45th Midwest Symposium on Circuits and Systems, IEEE Conference Proceedings, vol. 3, No. 4, Aug. 2002, pp. 5-8.

Chen et al., "High-Level Synthesis Algorithm for the Design of Reconfigurable Constant Multiplier," IEEE Transactions on Computer Aided Design of Integrated Circuits and Systems, vol. 28, No. 12, Dec. 2009, pp. 1844-1856.

(*Note: copies of NPL in parent appn).

ured to process the integrated circuit description so as to generate a circuit layout description of an integrated circuit
ERROR BOUNDED MULTIPLICATION BY INVARIANT RATIONALS

CROSS-REFERENCE TO RELATED APPLICATIONS AND CLAIM OF PRIORITY

This application is a continuation under 35 U.S.C. 120 of copending application Ser. No. 16/796,786 filed Feb. 20, 2020, which is a continuation of prior application Ser. No. 16/388,177 filed Apr. 18, 2019, now U.S. Pat. No. 10,606,588, which is a continuation of prior application Ser. No. 15/633,883 filed Jun. 27, 2017, now U.S. Pat. No. 10,310,816, which claims foreign priority under 35 U.S.C. 119 from United Kingdom Application No. 1611156.9 filed Jun. 27, 2016.

BACKGROUND

When designing integrated circuits, logic is often required to perform addition, subtraction, multiplication and division. Whilst addition, subtraction and multiplication operations can all be cheaply implemented (e.g. in terms of area of logic required) in hardware, division operations are acknowledged to be an expensive operation to implement in hardware.

In the case that the divisor is known to be a constant at design-time, a division operation can be expressed as multiplication by a constant fraction (also referred to as an 'invariant rational') and it is possible to construct efficient implementations of the division operation using a combination of addition and constant multiplication logic. This can simplify the logic significantly and hence reduce the area of integrated circuit needed to implement the division operation.

In various examples, the result from a division operation need not be calculated accurately but instead the result can be rounded to the nearest integer or otherwise approximated; however, in many examples, the error, $\varepsilon$, in the result (as defined as the difference between the accurate result R and the result generated R') needs to satisfy an error bound, $\varepsilon_{max}$, i.e.

$$\varepsilon = R - R'$$

$$|\varepsilon| \leq \varepsilon_{max}$$

This approximate calculation of a division operation may be referred to as 'lossy constant division'.

The embodiments described below are provided by way of example only and are not limiting of implementations which solve any or all of the disadvantages of known methods and hardware for implementing lossy constant division.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

A hardware logic representation of a circuit to implement an operation to perform multiplication by an invariant rational is generated by truncating an infinite single summation array (which is represented in a finite way). The truncation is performed by identifying a repeating section and then discarding all but a finite number of the repeating sections whilst still satisfying a defined error bound. To further reduce the size of the summation array, the binary representation of the invariant rational is converted into canonical signed digit notation prior to creating the finite representation of the infinite array.

A first aspect provides a method of generating a hardware logic implementation of an operation to multiply an input value by a predetermined invariant rational that satisfies a defined error bound, the method comprising: in response to determining that a binary expansion of the predetermined invariant rational comprises two adjacent non-zero bits, in a synthesizer module, truncating the binary expansion, converting the truncated binary expansion into canonical signed digit notation and expanding the canonical signed digit representation into a finite representation of an infinite expansion; generating, in the synthesizer module, a truncated single summation array from the infinite expansion by discarding one or more repeating sections of the array based upon the defined error bound; and generating, in the synthesizer module, a hardware representation implementing the truncated single summation array, wherein the generated hardware representation is the hardware logic implementation of an operation to multiply an input value by the predetermined invariant rational that satisfies the defined error bound.

A second aspect provides an apparatus configured to perform lossy synthesis of a an operation to multiply an input value by a predetermined invariant rational that satisfies a defined error bound and generate a hardware logic implementation of the operation, the apparatus comprising: a processor; and a memory comprising computer executable instructions which, when executed, cause the processor: in response to determining that a binary expansion of the predetermined invariant rational comprises two adjacent non-zero bits, to truncate the binary expansion, convert the truncated binary expansion into canonical signed digit notation and expand the canonical signed digit representation into a finite representation of an infinite expansion; to generate a truncated single summation array from the infinite expansion by discarding one or more repeating sections of the array based upon the defined error bound; and to generate a hardware representation implementing the truncated single summation array, wherein the generated hardware representation is the hardware logic implementation of an operation to multiply an input value by the predetermined invariant rational that satisfies the defined error bound.

The hardware logic implementation generated by the method described herein may be embodied in hardware on an integrated circuit. There may be provided a method of manufacturing, at an integrated circuit manufacturing system, the hardware logic implementation. There may be provided an integrated circuit definition dataset that, when processed in an integrated circuit manufacturing system, configures the system to manufacture the hardware logic implementation. There may be provided a non-transitory computer readable storage medium having stored thereon a computer readable description of an integrated circuit that, when processed, causes a layout processing system to generate a circuit layout description used in an integrated circuit manufacturing system to manufacture the hardware logic implementation.

There may be provided an integrated circuit manufacturing system comprising: a non-transitory computer readable storage medium having stored thereon a computer readable integrated circuit description that describes the hardware logic implementation; a layout processing system configured to process the integrated circuit description so as to generate a circuit layout description of an integrated circuit embodying the hardware logic implementation; and an integrated circuit generation system configured to manufacture the hardware logic implementation according to the circuit layout description.

There may be provided computer program code for performing a method as described herein. There may be provided non-transitory computer readable storage medium having stored thereon computer readable instructions that, when executed at a computer system, cause the computer system to perform the method as described herein.

The preferred features may be combined as appropriate, as would be apparent to a skilled person, and may be combined with any of the aspects of the invention.

BRIEF DESCRIPTION OF THE DRAWINGS

Embodiments of the invention will be described in detail with reference to the accompanying drawings in which.

Figure 1:
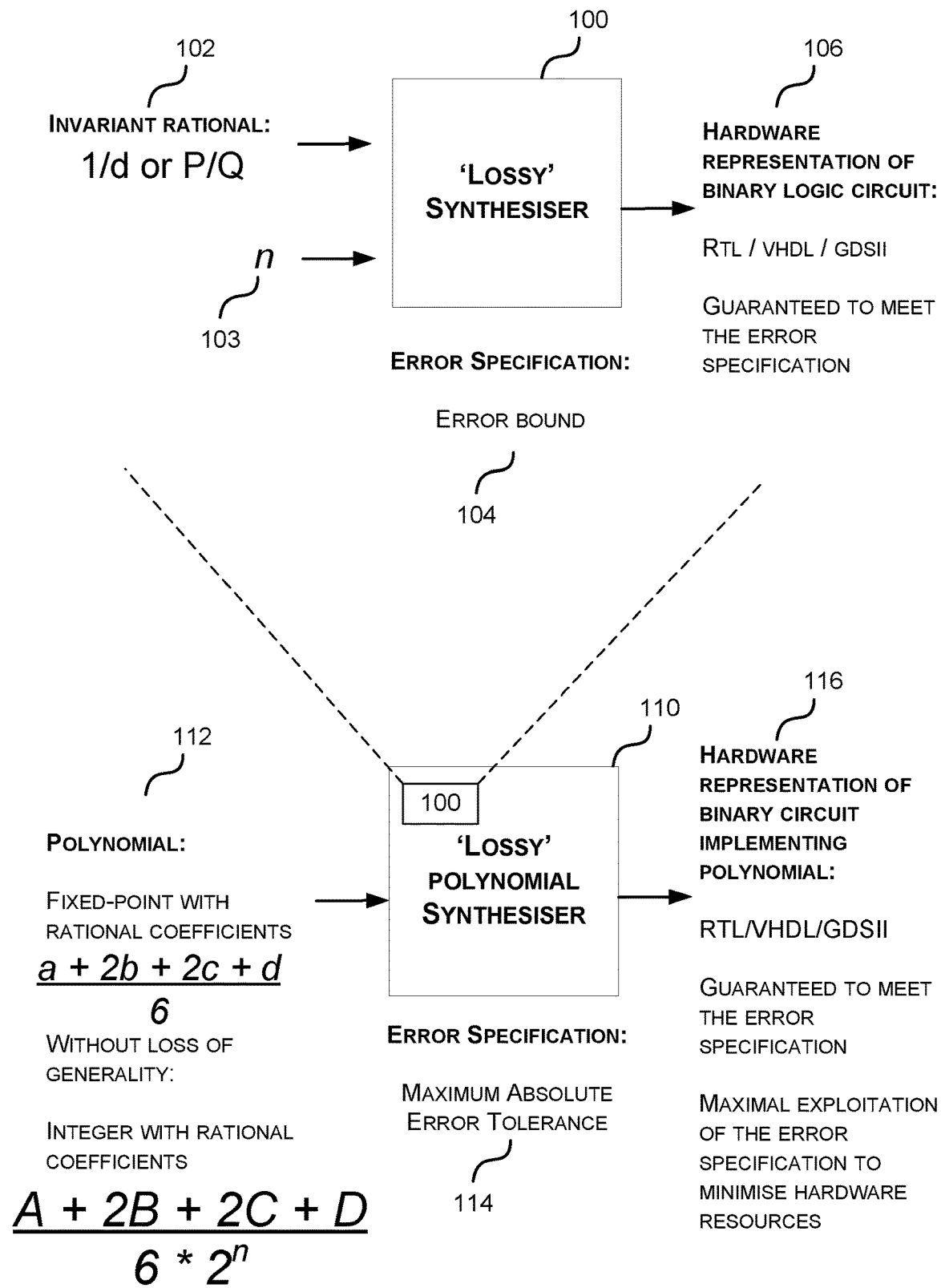
FIG. 1 is a schematic diagram of a lossy synthesizer.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

Embodiments of the present invention are described below by way of example only. These examples represent the best ways of putting the invention into practice that are currently known to the Applicant although they are not the only ways in which this could be achieved. The description sets forth the functions of the example and the sequence of steps for constructing and operating the example. However, the same or equivalent functions and sequences may be accomplished by different examples.

Described herein are methods for implementing multiplication by invariant rationals in hardware logic. The methods described reduce resource usage (e.g. area of hardware that is required) whilst providing a guaranteed bounded error. As described above, constant division is one example of multiplication by an invariant rational. In the methods described, the multiplication by an invariant rational is not evaluated to infinite precision but instead the methods enable exploitation of a maximum absolute error (which may be user defined) and so may be described as lossy.

Filters typically require the implementation of fixed-point polynomials with rational coefficients. Such a polynomial can be represented as a data-flow graph (DFG) with nodes that are either arithmetic sum-of-products (SOPs) or constant division operators. The methods for implementing multiplication by invariant rationals in hardware logic described herein and the resulting hardware logic can be used in a fixed-point filter as a constant division node. The total permissible error in the implementation of the polynomial may be divided into portions such that separate error bounds are allocated to each node in the DFG and hence this error bound allocated to a node may be used when determining the hardware logic to implement a constant division operation (i.e. the implementation of multiplication by an invariant rational).

FIG. 1 is a schematic diagram of an example synthesizer (or synthesizer module) 100 which may implement the methods described herein. As shown in FIG. 1, the synthesizer 100 takes as input 102 an invariant rational which may take the form 1/d or P/Q, where d is a positive, odd integer greater than one (i.e. d=2θ+1, where θ>0), P and Q which can be assumed to be coprime integers without loss of generality and Q is not a power of two. The synthesizer also takes as input 103 an input n describing the number of bits of x which will be multiplied by 1/d or P/Q (i.e. the bit width of x). An error specification 104 is also provided which provides a user bounded error (i.e. a maximum absolute error tolerance). The output 106 of the synthesizer 100 is a hardware representation of the binary logic circuit (e.g. in the form of RTL, a higher level circuit representation such as Verilog™ or VHDL or a lower level representation such as OASIS or GDSII) that is guaranteed to meet the error specification 104 and is suitable for datapath logic synthesis. A typical user requirement is that the result should be correct to the unit in the last place and this can be translated into an absolute error bound of the form $|\varepsilon| \leq 2^p$ where p is an integer. More generally, $|\varepsilon| \leq u2^p$ where u>1/2 and both u and p are provided as an input 104 to the synthesizer 100. The binary logic circuit (corresponding to the hardware 106) takes an input value, x, and generates an output of x/d or Px/Q, where x is an integer variable between 0 and integer M.

As described above, the hardware representation 106 generated by the lossy synthesizer 100 may be part of the hardware representation of a filter (which implements a polynomial) and so the lossy synthesizer 100 may be part of a larger synthesizer 110. This lossy polynomial synthesizer 110 takes as input 112 a polynomial with rational coefficients and fixed-point inputs and outputs. An error specification 114 is also provided which provides a user bounded error (i.e. a maximum absolute error tolerance) and the error bound 104 used by the lossy synthesizer 100 is a part of the user bounded error 114. The lossy polynomial synthesizer 110 may provide the value of E, the acceptable maximum absolute error tolerance, by providing p (the output precision), and u (the number of units in the last place of accuracy) to the lossy synthesizer 100. The output 116 of the lossy polynomial synthesizer 110 is a hardware representation of the binary logic circuit (e.g. in the form of RTL, a higher level circuit representation such as Verilog™ or VHDL or a lower level representation such as OASIS or GDSII) that is guaranteed to meet the error specification 104 and is suitable for datapath logic synthesis. A typical user requirement is again that the result should be correct to the unit in the last place and this can be translated into an absolute error bound.

The input 112 to the lossy polynomial synthesizer 110 is a fixed-point polynomial with rational coefficients, L, for example:

$$L = \frac{a + 2b + 2c + d}{6} \quad (1)$$

Without loss of generality, the polynomial may be written as a polynomial with integer constants and rational coefficients, for example of the following form for an appropriate value of r:

$$L = \frac{\alpha + 2\beta + 2\gamma + \delta}{6 * 2^r} \quad (2)$$

The binary logic circuit (corresponding to the hardware 116) takes input values, $\alpha$, $\beta$, $\gamma$ & $\delta$ and could generate output that produces an intermediate value x, as follows:

$$x = \alpha + 2\beta + 2\gamma + \delta \quad (3)$$
$$L = \frac{x}{6 * 2^r}$$

Figure 2:
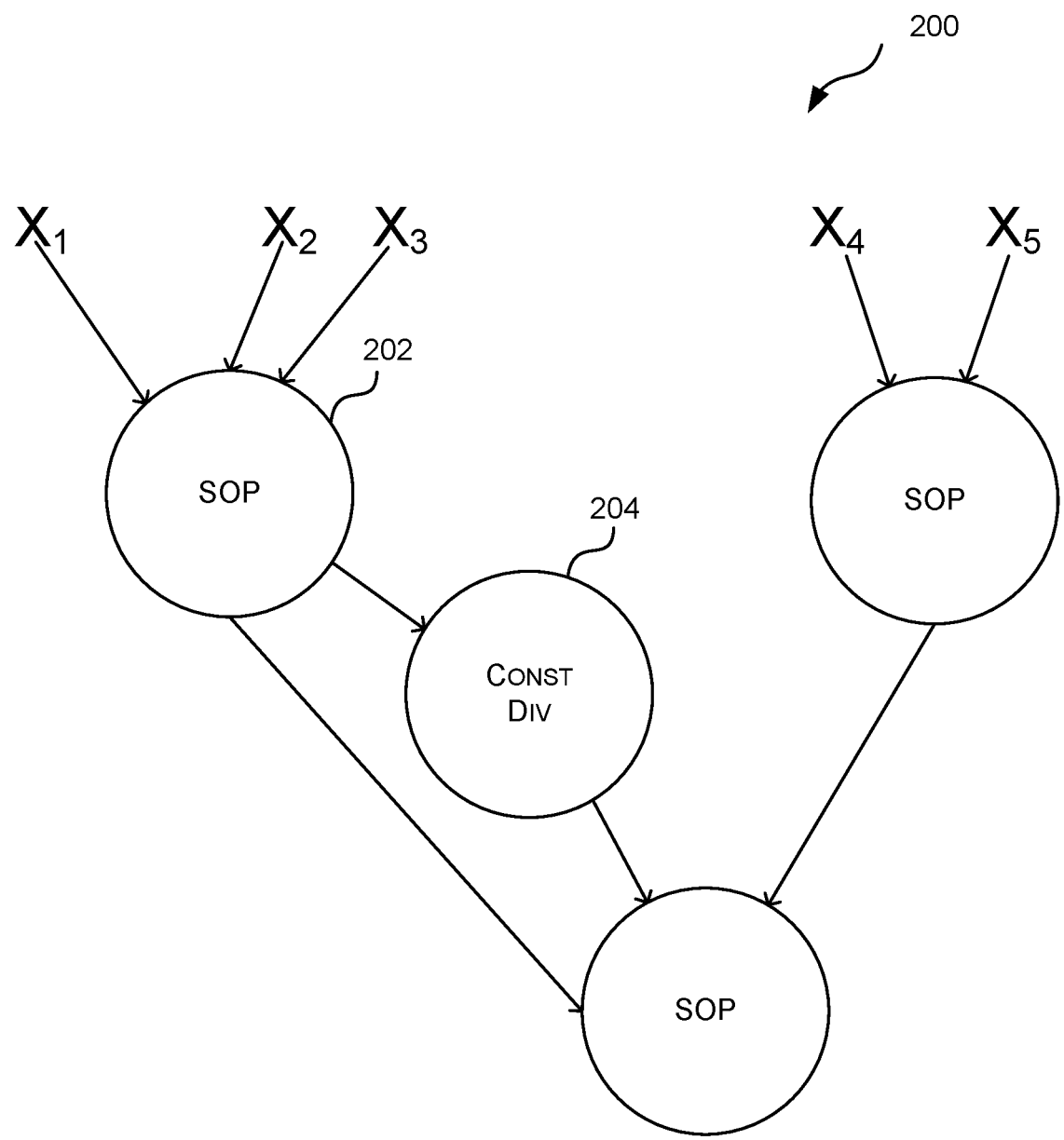
FIG. 2 shows an example data-flow graph.

The polynomial, L, that is input to the lossy synthesizer 110, may be represented as a DFG 200, as shown in FIG. 2, with nodes that are either arithmetic sum-of-products (SOPs) 202 or constant division operators 204 (block 302) and as described above, the maximum error for the polynomial 114 can be divided up and parts of this maximum error 114 allocated to each of the nodes 202, 204. The lossy synthesizer 100 may be used to generate the hardware implementation of the constant division node 204 taking as input the error bound 104 allocated to that node.

Figure 3:
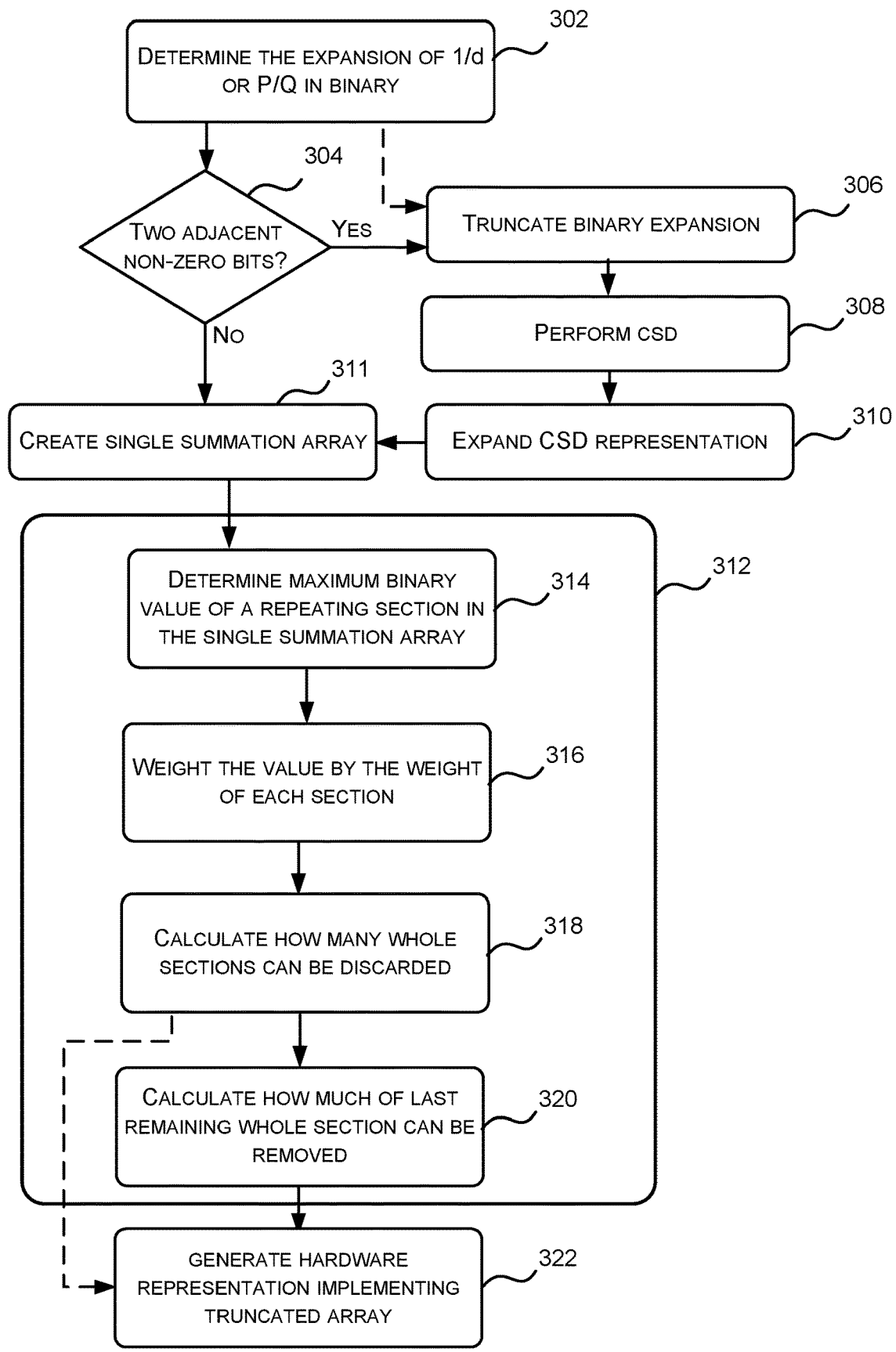
FIG. 3 is a flow diagram of an example method of operation of the lossy synthesizer shown in FIG. 1.

FIG. 3 is a flow diagram of an example method of operation of the lossy synthesizer 100, which will initially be described with reference to an invariant rational of the form 1/d and hence the method generates a hardware implementation of a binary circuit which takes an input x and performs the operation x/d. As noted above, d is a positive, odd integer greater than one. Initially it is assumed that x is an unsigned binary number; however, subsequent description explains the method where x is a signed binary number. Similarly, the method is subsequently described for an invariant rational of the form P/Q.

The method comprises truncation of an infinite array (which is represented in a finite way), the inclusion of a constant and a further truncation to the desired output precision, p. More precisely, the implementation y', when compared to the infinitely precise answer y will be:

$$y' = 2^P \left\lfloor \frac{y - \Delta + C}{2^P} \right\rfloor$$

where $\Delta$ are the bits removed from the infinite array and C is an added constant (which is added in to compensate for the removed bits, as described below).

Whilst the method described herein refers to creating and truncating an infinite array, it will be appreciated that a finite representation of the infinite array is actually formed (e.g. by reference to a repeating section).

The absolute error between y and y' is:

$$|\varepsilon| = |y - y'| = \left| y - 2^P \left\lfloor \frac{y - \Delta + C}{2^P} \right\rfloor \right| = |(y - \Delta + C) \bmod 2^P + \Delta - C|$$

For this to be acceptable in magnitude:

$|\varepsilon| \leq u2^P$ $-u2^P \leq (y - \Delta + C) \bmod 2^P + \Delta - C \leq u2^P$ Now the lower bound is most stressed when both the mod term and $\Delta$ are 0:

$-u2^P \leq -C$

The upper bound is most stressed when the mod term and $\Delta$ are maximal:

$2^P + \Delta_{max} - C \leq u2^P$

These equations are satisfied and give the greatest freedom to $\Delta$ if C is chosen to be as large as possible:

$C = u2^P$ and $\Delta_{max} \leq (2u-1)2^P$

As shown in FIG. 3, the method comprises generating (or taking as an input) the value of the invariant rational (e.g. 1/d) in binary (block 302). As the invariant rational can be expressed as:

$$\frac{1}{d} = \left( \frac{B}{2^m - 1} \right) = B(2^{-m} + 2^{-2m} + \ldots) \quad (4)$$

where m is a positive integer and B is an integer in the range $[0, 2^m - 2]$. Depending upon the value of d (which is a positive, odd integer), 1/d is a recurring expansion 404 with a repeating portion B, as shown graphically in the upper part of FIG. 4.

For example, if d=7, then 1/7 in binary is:
0.001001001001001001001001001001001001
001001001001001001001100100 . . .
and it can be seen that after the radix point there is a repeating section '001':
0.001|001|001| . . . .
Similarly for d=21, 1/21 in binary is:
0.000011000011000011000011000011000110
000110000110000110000011 00 . . .
and it can be seen that after the radix point there is a repeating section
'000011':
0.000011|000011|000011| . . . .
Similarly for d=49, 1/49 in binary is:
0.0000010100111001011110000010100111001
0111000001010011100101111 . . .
and it can be seen that after the radix point there is a repeating section
'000001010011100101111':
0.000001010011100101111|000001010011100101111| . . .

A single summation array (which may also be referred to as a binary array) could then be formed using the binary representation of 1/d. A summation array for a node is an array formed from all of the partial products corresponding to the operator (e.g. a constant division or SOP operator), e.g. which implements equation (4) above. However, to reduce the size of the single summation array (which produces area, delay and power benefits in the resultant hardware) for binary representations comprising adjacent non-zero bits ('Yes' in block 304), the binary representation may first be converted into canonical signed digit representation (CSD) in which each bit can be a 1, 0 or −1 (shown as $\bar{1}$) and in which no two adjacent bits are non-zero (block 308). In the event that the binary representation does not comprise adjacent non-zero bits ('No' in block 304), the CSD conversion may be omitted because the CSD representation is the same as the binary representation. Alternatively, CSD may always be performed (as indicated by the dotted arrow from block 302 to block 306) and for binary representations (which may also be referred to as binary expansions) with no adjacent ones, the CSD operation (in block 308) will leave the representation unchanged.

The algorithms for converting a binary representation to CSD operate on a finite binary number and as described above, if d is an odd number, 1/d in binary is not terminating (and hence is not finite in terms of the number of bits required) but is instead a recurring expansion. Consequently, in the event that CSD is to be used (in block 308), the binary representation (from block 302) is first truncated (block 306) before the truncated binary representation is converted into CSD (in block 308).

Figure 4:
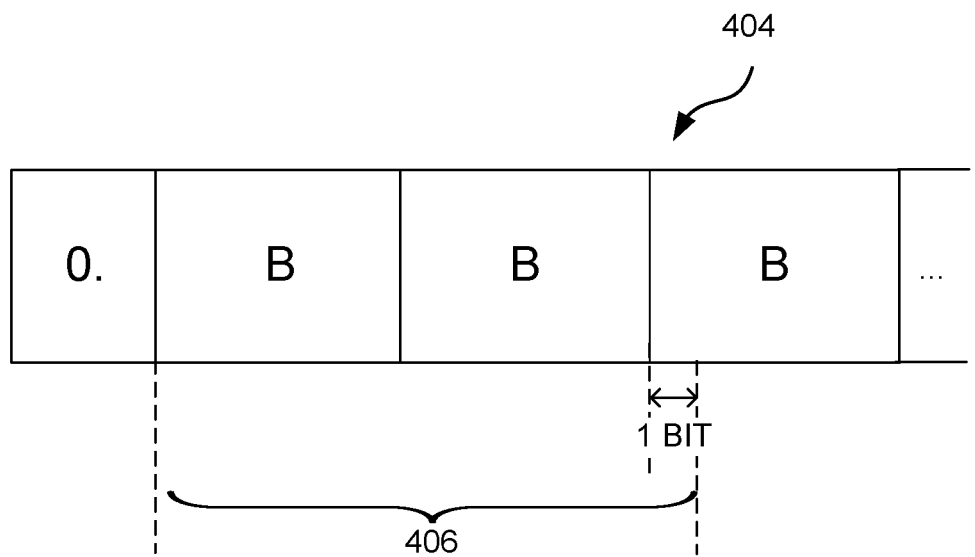
FIG. 4 is a graphical representation of elements of the method of FIG. 3.
Figure 4:
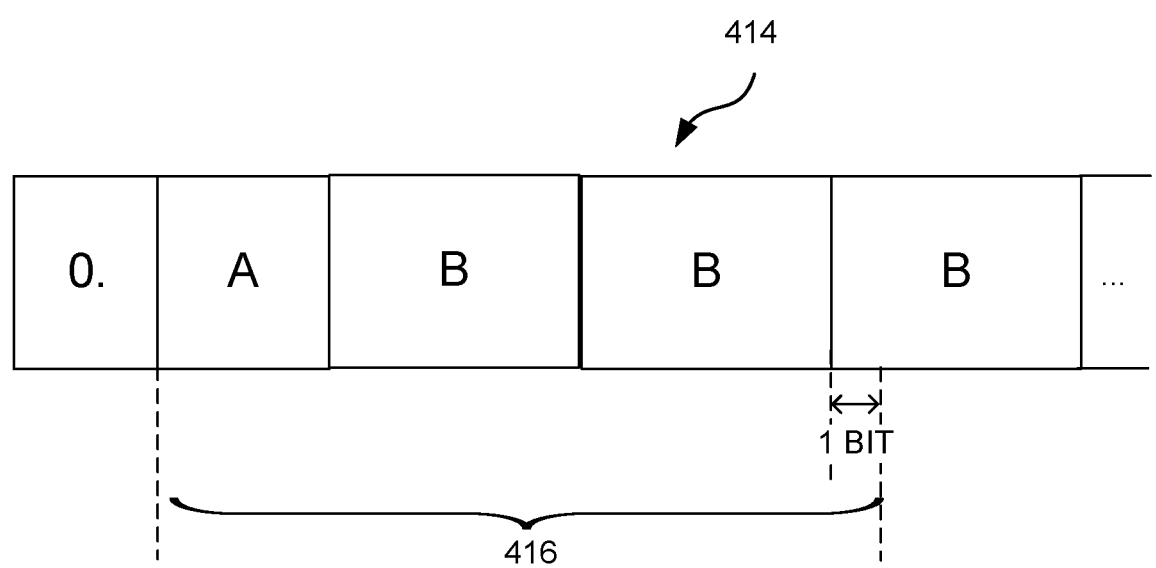

The truncation (in block 306) involves taking all the bits from a plurality of complete repeating sections (e.g. 2 repeating sections) and one extra bit from the next section (when working from left to right), as shown by bracket 406 in FIG. 4. Referring to the examples above, the truncation may for example comprise, for d=21, truncating:
0.00001100001100001100001100001100001100001100001100001100001100001100001100001100001100 00 . . .
to be:
0.0000110000110
and for d=49, truncating:
0.000001010011100101111000001010011
1001011110000010100111100101 111 . . .
0.00000101001110010111100000101001110010111110
Taking the example with d=21, if binary representation:
0.0000110000110
is converted into CSD notation, this becomes:
0.00010$\bar{1}$00010$\bar{1}$0
which has a repeating section: 00010$\bar{1}$ which is the same length as the repeating section prior to conversion into CSD notation.

Taking the example with d=49, if binary representation:
0.00000101001110010111100000101001110010111110
is converted into CSD notation, this becomes:
0.0000010101000$\bar{1}$010$\bar{1}$000$\bar{1}$0000010101000$\bar{1}$010$\bar{1}$000$\bar{1}$0
which has a repeating section: 000001010100
10$\bar{1}$000$\bar{1}$ which is again the same length as the repeating section prior to conversion into CSD notation.

Having converted the truncated representation into CSD (in block 308), the resulting CSD representation also comprises a recurring portion and this recurring portion is the same length (i.e. comprises the same number of bits) as the recurring portion in the binary representation, as shown in the examples above, and so the CSD representation can then be extended to form an infinite CSD representation by repeating this recurring portion (block 310).

Figure 5:
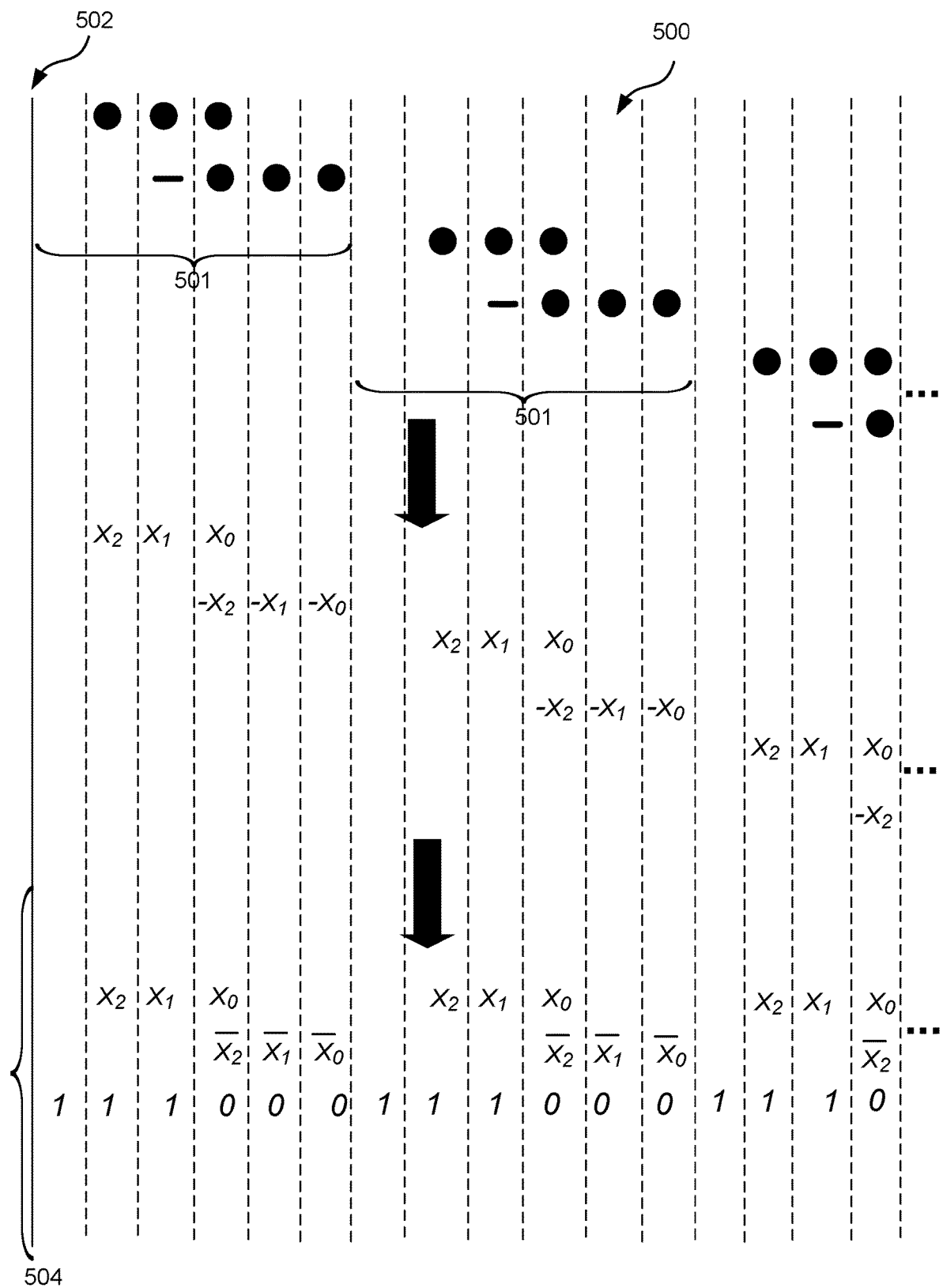
FIG. 5 is a further graphical representation of elements of the method of FIG. 3.

A single summation array is then created from the infinite CSD representation (block 311) and as the representation is infinite, the complete array is also infinite. This summation array (created in block 311) however, also comprises a repeating portion 501 and the portion has a length of m bits (where this number of bits, m, is the same as the number of bits in the recurring sections in the CSD representation and the binary representation). Part of an example infinite array 500 for d=21 and for an input value x between having 3 bits is shown in FIG. 5 and where the vertical line 502 indicates the position of the radix point.

Consequently, the single summation array is truncated (block 312) before it is implemented in the hardware representation (block 322, e.g. by summing the bits in the different binary weighted columns in the truncated array). The constant, C, (as defined above) is added back into the array before producing the final truncated array (e.g. between block 312 and block 322 in FIG. 3). The formation of the array (in block 311) and the truncation of the array (in block 312) are described in more detail below. As described above, the hardware representation of the truncated array which is output by the method of FIG. 3 may be in the form of RTL (e.g. in VHDL), GDSII, etc. This hardware representation may then be implemented (i.e. fabricated) in hardware (e.g. in silicon) as part of a filter or other electronic circuit, e.g. a filter which is used in bilinear or trilinear filtering or other forms of image filtering.

As described above, the hardware representation of the truncated array which is output by the method of FIG. 3 may be in the form of RTL (e.g. in VHDL), GDSII, etc. This hardware representation may then be implemented (i.e. fabricated) in hardware (e.g. in silicon) as part of a filter or other electronic circuit, e.g. a filter which is used in bilinear or trilinear filtering or other forms of image filtering.

As part of the array formation (in block 311), all the negative bits (shown as $\bar{1}$ above) are transformed into inverted bits and a constant Z is added, since $-x=\tilde{x}+1$. If for various i and j the value of the recurring bits to be negated is given by:

$$-\frac{1}{2^m-1}\sum_{i,j} 2^i x_j \qquad (5)$$

where i ranges from 0 to m−1, and j varies from 0 to n−1 but only some of these terms are present (depending on where negated bits of x are in the binary array).

The summation in equation (5) is the same as:

$$\frac{1}{2^m-1}\sum_{i,j} 2^i \bar{x}_J - \frac{1}{2^m-1}\sum_{i,j} 2^i$$

Therefore, all the negated bits in the array can be replaced with inverted bits and the following constant, Z, is computed and then added into the array (e.g. as shown in the final part 504 of FIG. 5):

$$Z = -\frac{1}{2^m-1}\sum_{i,j} 2^i$$

For example, in the case of n being 3 and d=21 (m=6):

$$Z = -\frac{1}{63}\sum_{i=0\ldots 2} 2^i x_i = \frac{1}{63}\sum_{i=0\ldots 2} 2^i \bar{x}_i - \frac{7}{63}$$

So the constant, $Z=-7/63=-1+56/63$ would need adding into the array ($56/63=0.111000111000111000\ldots$ and in twos complement notation, $-1=\ldots 111.000000\ldots$).

When truncating the array (in block 312), the maximum value of the repeated section is determined (block 314) and this enables the bounding of the error introduced by truncating the infinite array. As shown in the example in FIG. 5, there will be copies of $x_i$ and $\overline{x}_i$ in various columns so there exist positive integers $a_i$ and $b_i$ such that the value of the repeated section, $D$, can be expressed as follows:

$$D = \sum_{i=0}^{n-1}(a_i x_i + b_i \overline{x}_i) + k =$$

$$\sum_{i=0}^{n-1}(a_i x_i - b_i x_i) + \left(k + \sum_{i=0}^{n-1} b_i\right) = \sum_{i=0}^{n-1}(a_i - b_i)x_i + \left(k + \sum_{i=0}^{n-1} b_i\right)$$

We can then separate out those terms when $a_i-b_i$ is negative and when it is positive (i.e. when $a_i > b_i$):

$$= \sum_{\substack{i=0 \\ a_i > b_i}}^{n-1} x_i(a_i - b_i) + \sum_{\substack{i=0 \\ a_i <= b_i}}^{n-1} x_i(a_i - b_i) + \left(k + \sum_{i=0}^{n-1} b_i\right)$$

The value $D_{max}$ can be calculated by noting that $D$ is maximised by setting $x_i=1$ when $a_i > b_i$ and $x_i=0$ otherwise, hence:

$$D_{max} = \Sigma_{i=0, a_i > b_i}^{n-1}(a_i - b_i) + (k + \Sigma_{i=0}^{n-1} b_i) \quad (6)$$

The result, $D_{max}$, is then weighted by the weight of each section (block 316), where this weight is given by:

$$\frac{1}{2^m - 1} \quad (7)$$

Using this, the number, $r$, of whole sections which are retained (block 318) is determined by finding the minimum value of $r$ which satisfies:

$$\frac{D_{max} 2^{-rm}}{2^m - 1} \leq (2u-1)2^p \quad (8)$$

The smallest such $r$ is:

$$r_{min} = \left\lceil \frac{1}{m}\left(\left(\log_2 \frac{D_{max}}{(2^m-1)(2u-1)}\right) - p\right)\right\rceil \quad (9)$$

where, as detailed above:

$$|\varepsilon| \leq u 2^p$$

Referring to the example shown in FIG. 5 (for $d=21$, where $m=6$) and if $u=1$ and $p=-6$:

$$D = 2^0(\overline{x_0}) + 2^1 \overline{x_1} + 2^2(\overline{x_2} + x_0) + 2^3(x_1+1) + 2^4(x_2+1) + 2^5$$

$$D = (3x_0 + 6x_1 + 12x_2) + 63$$

So, using equation (6):

$$D_{max} = (3+6+12) + 63 = 84$$

And, using equation (9):

$$r_{min} = \left\lceil \frac{1}{6}\left(\left(\log_2 \frac{84}{(2^6-1)(2*1-1)}\right) + 6\right)\right\rceil = 2$$

And in this case $r_{min}=2$.

Having removed many of the whole sections (in block 318), the truncation may also discard one or more columns from the last remaining whole section (in block 320). The value that these discarded columns may contain must be less than or equal to:

$$(2u-1)2^p - \frac{D_{max} 2^{-r_{min} m}}{2^m - 1} \quad (10)$$

If $D_i$ is the value of the least significant $i$ columns of the repeating section, these values can be computed in a similar fashion to $D$ (e.g. as described above). In the case of $d=21$ and referring to FIG. 5:

$$D_1 = \overline{x_0} = -x_0 + 1$$

$$D_2 = 2\overline{x_1} + \overline{x_0} = -(2x_1 + x_0) + 3$$

$$D_3 = 4x_0 + 4\overline{x_2} + 2\overline{x_1} + \overline{x_0} = (3x_0) - (4x_2 + 2x_1) + 7$$

$$D_4 = 8x_1 + 8 + 4x_0 + 4\overline{x_2} + 2\overline{x_1} + \overline{x_0} = (6x_1 + 3x_0) - (4x_2) + 15$$

$$D_5 =$$
$$16x_2 + 16 + 8x_1 + 8 + 4x_0 + 4\overline{x_2} + 2\overline{x_1} + \overline{x_0} = (12x_2 + 6x_1 + 3x_0) + 31$$

$$D_6 = 32 + 16x_2 + 16 + 8x_1 + 8 + 4x_0 + 4\overline{x_2} + 2\overline{x_1} + \overline{x_0} =$$
$$(12x_2 + 6x_1 + 3x_0) + 63$$

The maximum values of these can be calculated in a similar fashion to $D_{max}$:

$$D_{1,max}=1, D_{2,max}=3, D_{3,max}=3-0+7=10$$

$$D_{4,max}=(6+3)-0+15=24$$

$$D_{5,max}=(12+6+3)+31=52$$

$$D_{6,max}=D_{max}=(12+6+3)+63=84$$

The number of additional columns to truncate having retained only $r$ copies of repeated section is the largest $i$ such that:

$$D_{i,max} 2^{-r_{min} m} \leq (2u-1)2^p - \frac{D_{max} 2^{-r_{min} m}}{2^m - 1}$$

$$D_{i,max} + \frac{D_{max}}{2^m - 1} \leq (2u-1)2^{p+r_{min} m}$$

In the case of $d=21$, $m=6$, $r_{min}=2$, $D_{max}=84$, $u=1$, $p=-6$:

$$D_{i,max} + \frac{84}{63} \leq 2^6$$

In this case, the maximum $i$ is 5 as $52+84/63 \leq 64$.

Having discarded none, one or more columns from the last whole section, in some examples none, one or more bits from the last remaining column may also be discarded if this is possible without violating the error bound.

The truncation (in block 312) may be described as "greedy eating" because bits are discarded starting at the least significant bits (LSBs) until the error bound is reached.

By using the method shown in FIG. 3 and described above, the resulting hardware is smaller and is guaranteed to meet the defined maximum error requirement.

Figure 6:
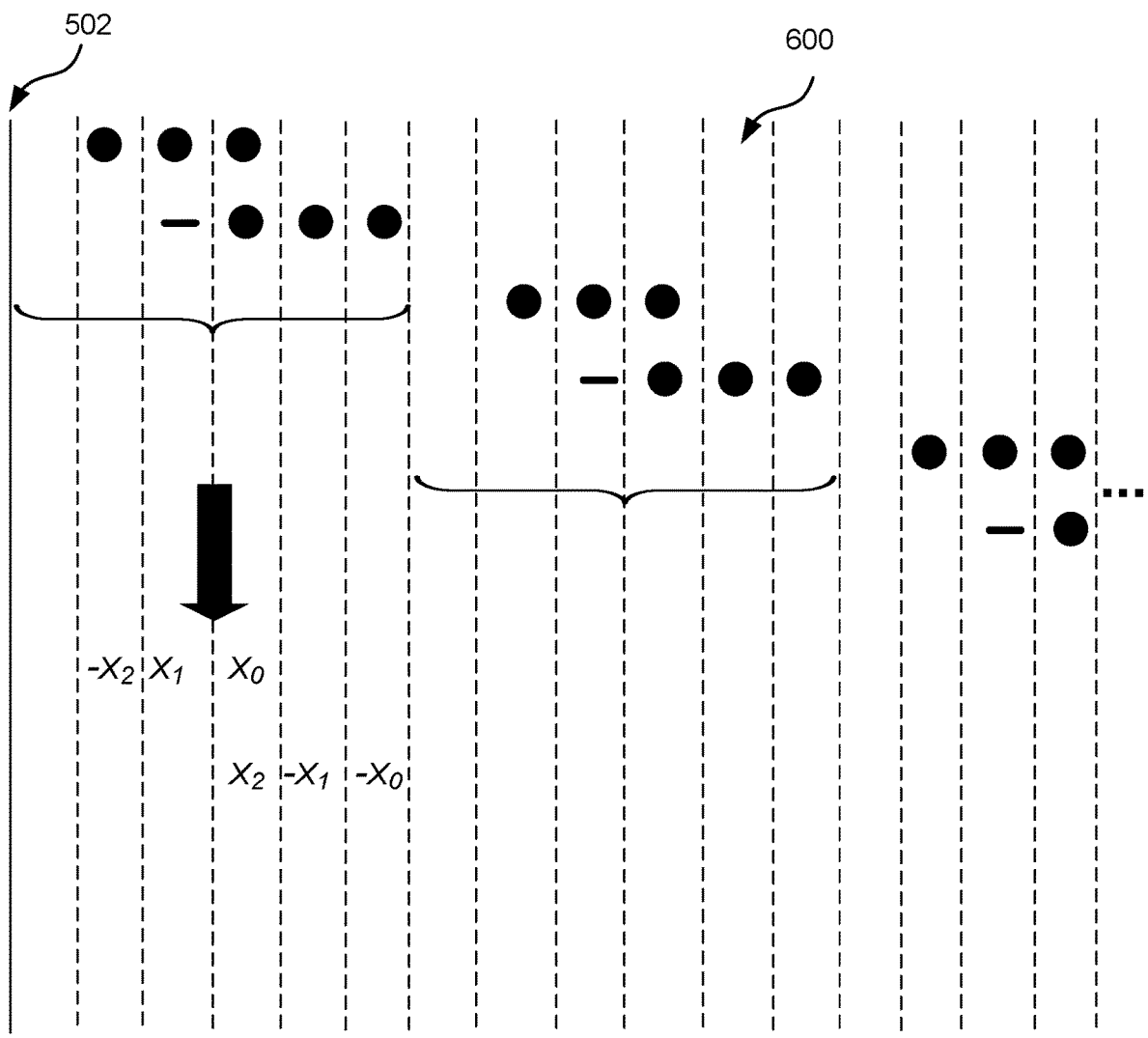
FIG. 6 is another graphical representation of elements of the method of FIG. 3.

In the examples described above, the input x (which is multiplied by the invariant rational, 1/d, in the hardware representation which is generated) is an unsigned number. The method may also be used where x is a signed number. The method operates as described above, with the only exception that a negative weight is applied to the most significant bit. This is shown in FIG. 6 which shows the same example as FIG. 5, except that the input number, x, is a signed twos complement input which can take negative numbers.

In the examples described above, the invariant rational has the form 1/d where d is an odd integer that is greater than one. The methods however may be used where the invariant rational has the form P/Q where P and Q are assumed to be coprime integers without loss of generality and Q is not a power of two. In such examples, equation (4) above is modified to be:

$$\frac{P}{Q} = \frac{1}{2q}\left(A + \frac{B}{2^m - 1}\right) \quad (11)$$

where A is a positive integer. P/Q is a recurring expansion 414 with a repeating portion B, as shown graphically in the lower part of FIG. 4.

For example, if P=7 and Q=12, then 7/12 in binary is:
0.1001010101010101010101010101010101010101
01010101010101010101 . . .
and it can be seen that after the radix point there is a first 'A' section '10' followed by a repeating 'B' section '01':
0.10|01|01| . . .
Similarly for P=11, Q=12, then 11/12 in binary is:
0.1110101010101010101010101010101010101
01010101010101010101010 . . .
and it can be seen that after the radix point there is a first 'A' section '11' followed by a repeating 'B' section '10' (although, as shown by this example, the decomposition of P/Q into sections A and B is not unique; however, this does not affect the final result):
0.11|10|10| . . .
Similarly for P=7, Q=22, then 7/22 in binary is:
0.01010001011101000101110100010111
01000101110100010111010001011101 . . .
and it can be seen that after the radix point there is a first 'A' section '01' followed by a repeating 'B' section '0100010111':
0.01|0100010111|0100010111| . . .

Of these three examples, the first (P/Q=7/12) does not comprise two adjacent non-zero bits ('No' in block 304) so CSD (if used) would not change the representation, but the other two examples would result in a different CSD representation when converted into CSD (in blocks 306-310). For an invariant rational of the form P/Q, the truncation (in block 306) involves taking all the bits from the first 'A' section, all the bits from a plurality of complete repeating sections (e.g. 2 repeating sections) and one extra bit from the next section (when working from left to right), as shown by bracket 416 in the lower part of FIG. 4.

Referring to the examples above, the truncation may for example comprise, for P=11, Q=12, truncating:
0.1110101010101010101010101010101
01010101010101010101010 . . .
to be:
0.1110101
and for P=7, Q=22, truncating:
0.01010001011101000101110100010111101
00010111010001011101000010111 . . .
to be:
0.01010001011101000101110

Taking the example with P=11, Q=12, if binary representation:
0.1110101
is converted into CSD notation, this becomes:
1.00$\bar{1}$0101
which has a first section 1.00$\bar{1}$0 followed by a repeating section 10. As shown in this example, the first 'B' section ($\bar{1}$0) may be altered by the presence of A (00 following the radix point) and is hence absorbed into the first section and it is the second copy of B (10) that is replicated after CSD is applied. As before, the number of bits in each section remain the same as before applying CSD (e.g. 2 bits in A after the radix point, 2 bits in the first B section and 2 bits in the next B section).

Taking the example with P=7, Q=22, if binary representation:
0.01010001011101000101110
is converted into CSD notation, this becomes:
0.01010010$\bar{1}$00$\bar{1}$010010$\bar{1}$00$\bar{1}$0
which has a first section 01010010$\bar{1}$00$\bar{1}$ (which is the combination of the A section and the first B section) followed by a repeating section 010010$\bar{1}$00$\bar{1}$ (which corresponds to the second B section).

The method then proceeds as described above with reference to FIG. 3, except that in the earlier equations q=0, so equations (8)-(10) become:

$$\frac{D_{max}2^{-rm-q}}{2^m - 1} \leq (2u - 1)2^p \quad (8')$$

$$r_{min} = \left\lceil \frac{1}{m}\left(\left(\log_2 \frac{D_{max}}{(2^m - 1)(2u - 1)}\right) - p - q\right)\right\rceil \quad (9')$$

$$(2u - 1)2^p - \frac{D_{max}2^{-r_{min}m-q}}{2^m - 1} \quad (10)$$

Furthermore, as noted above, due to the conversion into CSD representation, the first recurring B section may differ from the subsequent B sections. Consequently, when calculating $D_{max}$ (using equation (6)), this may be calculated for the repeated second B section and the combination of the A section and the first B section as a single special preamble.

When performing the truncation (in block 312), it is the repeating 'B' section which is considered (in blocks 314-318) and not the initial 'A' section. However, the initial 'A' block may, in some examples, be partially truncated (in block 320, e.g. where r=0 such that all the repeating B sections are discarded).

By using the methods described above (e.g. as shown in FIG. 3), a hardware logic design (e.g. in RTL) can be generated which occupies a smaller area when fabricated (e.g. a smaller area of silicon) but still guarantees to meet a defined error requirement (which may be faithful rounding of the result of the division operation). This aids miniaturization of components and the devices (e.g. smartphones, tablet computers and other computing devices) in which the components are used. In addition, or instead, it enables more functionality to be implemented within a similar area of silicon chip. By reducing the physical size (i.e. area) that is used, more ICs can be fabricated from a single silicon wafer, which reduces the overall cost per die.

Figure 7:
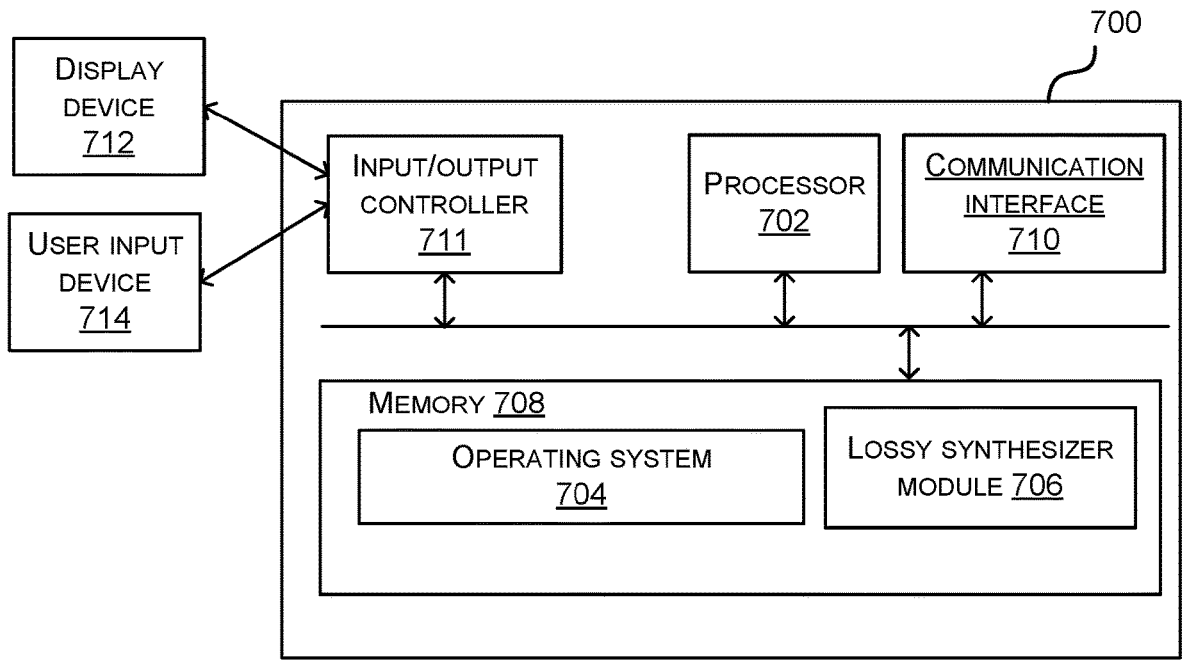
FIG. 7 is a schematic diagram of an example computing device which may be configured to implement the methods described herein.

FIG. 7 illustrates various components of an exemplary computing-based device 700 which may be implemented as any form of a computing and/or electronic device, and in which embodiments of the methods described herein may be implemented.

Computing-based device 700 comprises one or more processors 702 which may be microprocessors, controllers or any other suitable type of processors for processing computer executable instructions to control the operation of the device in order to perform the methods described herein (e.g. the method of FIG. 3 or FIG. 10). In some examples, for example where a system on a chip architecture is used, the processors 702 may include one or more fixed function blocks (also referred to as accelerators) which implement a part of the method of generating a hardware representation (e.g. RTL) for a constant division operation (which may also be described as multiplication by an invariant rational) in hardware (rather than software or firmware). Platform software comprising an operating system 704 or any other suitable platform software may be provided at the computing-based device to enable application software, such as a lossy synthesizer module 706 (which performs the method of FIG. 3) to be executed on the device.

The computer executable instructions may be provided using any computer-readable media that is accessible by computing based device 700. Computer-readable media may include, for example, computer storage media such as memory 708 and communications media. Computer storage media (i.e. non-transitory machine readable media), such as memory 708, includes volatile and non-volatile, removable and non-removable media implemented in any method or technology for storage of information such as computer readable instructions, data structures, program modules or other data. Computer storage media includes, but is not limited to, RAM, ROM, EPROM, EEPROM, flash memory or other memory technology, CD-ROM, digital versatile disks (DVD) or other optical storage, magnetic cassettes, magnetic tape, magnetic disk storage or other magnetic storage devices, or any other non-transmission medium that can be used to store information for access by a computing device. In contrast, communication media may embody computer readable instructions, data structures, program modules, or other data in a modulated data signal, such as a carrier wave, or other transport mechanism. As defined herein, computer storage media does not include communication media. Although the computer storage media (i.e. non-transitory machine readable media, e.g. memory 708) is shown within the computing-based device 700 it will be appreciated that the storage may be distributed or located remotely and accessed via a network or other communication link (e.g. using communication interface 710).

The computing-based device 700 may also comprise an input/output controller 711 arranged to output display information to a display device 712 which may be separate from or integral to the computing-based device 700. The display information may provide a graphical user interface. The input/output controller 711 is also arranged to receive and process input from one or more devices, such as a user input device 714 (e.g. a mouse or a keyboard). This user input may be used to specify maximum error bounds (e.g. for use in the method of FIG. 3). In an embodiment the display device 712 may also act as the user input device 714 if it is a touch sensitive display device. The input/output controller 711 may also output data to devices other than the display device, e.g. a locally connected printing device (not shown in FIG. 7).

The hardware representation of multiplication by a predetermined invariant rational described herein may be embodied in hardware on an integrated circuit using the methods described above. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), physics processing units (PPUs), radio processing units (RPUs), digital signal processors (DSPs), general purpose processors (e.g. a general purpose GPU), microprocessors, any processing unit which is designed to accelerate tasks outside of a CPU, etc. A computer or computer system may comprise one or more processors. Those skilled in the art will realize that such processing capabilities are incorporated into many different devices and therefore the term 'computer' includes set top boxes, media players, digital radios, PCs, servers, mobile telephones, personal digital assistants and many other devices.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture an apparatus configured to perform any of the methods described herein, or to manufacture a hardware representation of an operator which performs multiplication by a predetermined invariant rational. An integrated circuit definition dataset may be, for example, an integrated circuit description.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS® and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a hardware implementation of an operator which performs multiplication by a predetermined invariant rational will now be described with respect to FIG. 8.

Figure 8:
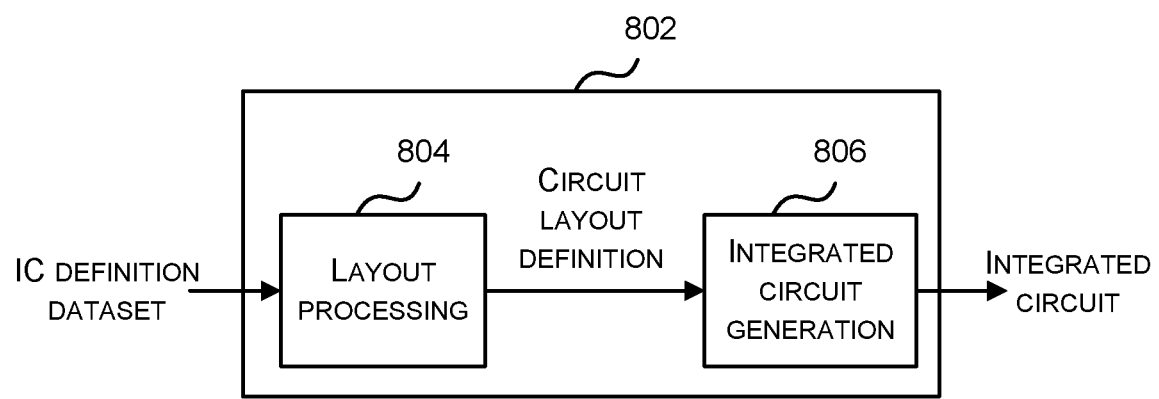
FIG. 8 shows an integrated circuit manufacturing system for generating an integrated circuit comprising hardware implementing multiplication by a predetermined invariant rational.

FIG. 8 shows an example of an integrated circuit (IC) manufacturing system 802 which comprises a layout processing system 804 and an integrated circuit generation system 806. The IC manufacturing system 802 is configured to receive an IC definition dataset (e.g. defining a hardware implementation of an operator which performs multiplication by a predetermined invariant rational as described in any of the examples herein), process the IC definition dataset, and generate an IC according to the IC definition dataset (e.g. which embodies a hardware implementation of an operator which performs multiplication by a predetermined invariant rational as described in any of the examples herein). The processing of the IC definition dataset configures the IC manufacturing system 802 to manufacture an integrated circuit embodying a hardware implementation of an operator which performs multiplication by a predetermined invariant rational as described in any of the examples herein.

The layout processing system 804 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 804 has determined the circuit layout it may output a circuit layout definition to the IC generation system 806. A circuit layout definition may be, for example, a circuit layout description.

The IC generation system 806 generates an IC according to the circuit layout definition, as is known in the art. For example, the IC generation system 806 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 806 may be in the form of computer-readable code which the IC generation system 806 can use to form a suitable mask for use in generating an IC.

The different processes performed by the IC manufacturing system 802 may be implemented all in one location, e.g. by one party. Alternatively, the IC manufacturing system 802 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture an operator which performs multiplication by a predetermined invariant rational without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 8 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 8, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Those skilled in the art will also realize that by utilizing conventional techniques known to those skilled in the art that all, or a portion of the software instructions may be carried out by a dedicated circuit, such as a DSP, programmable logic array, or the like.

The methods described herein may be performed by a computer configured with software in machine readable form stored on a tangible storage medium e.g. in the form of a computer program comprising computer readable program code for configuring a computer to perform the constituent portions of described methods or in the form of a computer program comprising computer program code means adapted to perform all the steps of any of the methods described herein when the program is run on a computer and where the computer program may be embodied on a computer readable storage medium. Examples of tangible (or non-transitory) storage media include disks, thumb drives, memory cards etc. and do not include propagated signals. The software can be suitable for execution on a parallel processor or a serial processor such that the method steps may be carried out in any suitable order, or simultaneously.

The hardware components described herein may be generated by a non-transitory computer readable storage medium having encoded thereon computer readable program code.

Memories storing machine executable data for use in implementing disclosed aspects can be non-transitory media. Non-transitory media can be volatile or non-volatile. Examples of volatile non-transitory media include semiconductor-based memory, such as SRAM or DRAM. Examples of technologies that can be used to implement non-volatile memory include optical and magnetic memory technologies, flash memory, phase change memory, resistive RAM.

A particular reference to "logic" refers to structure that performs a function or functions. An example of logic includes circuitry that is arranged to perform those function(s). For example, such circuitry may include transistors and/or other hardware elements available in a manufacturing process. Such transistors and/or other elements may be used to form circuitry or structures that implement and/or contain memory, such as registers, flip flops, or latches, logical operators, such as Boolean operations, mathematical operators, such as adders, multipliers, or shifters, and interconnect, by way of example. Such elements may be provided as custom circuits or standard cell libraries, macros, or at other levels of abstraction. Such elements may be interconnected in a specific arrangement. Logic may include circuitry that is fixed function and circuitry can be programmed to perform a function or functions; such programming may be provided from a firmware or software update or control mechanism. Logic identified to perform one function may also include logic that implements a constituent function or sub-process. In an example, hardware logic has circuitry that implements a fixed function operation, or operations, state machine or process.

Any range or device value given herein may be extended or altered without losing the effect sought, as will be apparent to the skilled person.

It will be understood that the benefits and advantages described above may relate to one embodiment or may relate to several embodiments. The embodiments are not limited to those that solve any or all of the stated problems or those that have any or all of the stated benefits and advantages.

Any reference to 'an' item refers to one or more of those items. The term 'comprising' is used herein to mean including the method blocks or elements identified, but that such blocks or elements do not comprise an exclusive list and an apparatus may contain additional blocks or elements and a method may contain additional operations or elements. Furthermore, the blocks, elements and operations are themselves not impliedly closed.

The steps of the methods described herein may be carried out in any suitable order, or simultaneously where appropriate. The arrows between boxes in the figures show one example sequence of method steps but are not intended to exclude other sequences or the performance of multiple steps in parallel. Additionally, individual blocks may be deleted from any of the methods without departing from the spirit and scope of the subject matter described herein. Aspects of any of the examples described above may be combined with aspects of any of the other examples described to form further examples without losing the effect sought. Where elements of the figures are shown connected by arrows, it will be appreciated that these arrows show just one example flow of communications (including data and control messages) between elements. The flow between elements may be in either direction or in both directions.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. A method of synthesizing a representation of a hardware logic multiplier configured to multiply an input value by a predetermined invariant rational that satisfies a defined error bound, wherein the method is performed by at least one processor, and the method comprising, by at least one processor:
   truncating a binary expansion of the predetermined invariant rational;
   converting the truncated binary expansion into canonical signed digit notation and expanding the canonical signed digit representation into a finite representation of an infinite expansion;
   generating a truncated single summation array from the infinite expansion by discarding one or more repeating sections of the array based upon the defined error bound; and
   synthesizing the representation of the hardware logic multiplier using said truncated single summation array.

2. The method according to claim 1, further comprising:
   determining the binary expansion of the predetermined invariant rational.

3. The method according to claim 1, wherein generating a truncated single summation array from the infinite expansion by discarding one or more repeating sections of the array comprises:
   determining a maximum binary value of a repeating section in a finite representation of an infinite single summation array generated from the infinite expansion;

weighting the maximum binary value by a weight of each section; and calculating a minimum number of whole repeating sections to be retained within the truncated single summation array to satisfy the defined error bound.

4. The method according to claim 3, wherein generating a truncated single summation array from the infinite expansion by discarding one or more repeating sections of the array further comprises:

identifying one or more bits from a retained whole repeating section that can be discarded from the truncated single summation array whilst satisfying the defined error bound.

5. The method according to claim 1, further comprising: fabricating the hardware logic multiplier.

6. The method according to claim 5, wherein the hardware logic multiplier is fabricated in silicon.

7. A non-transitory computer readable storage medium having stored thereon computer executable instructions to synthesize a representation of a hardware logic multiplier, the computer executable instructions being arranged, when executed by a processor, to cause the processor to:

truncate a binary expansion of a predetermined invariant rational, convert the truncated binary expansion into canonical signed digit notation and expand the canonical signed digit representation into a finite representation of an infinite expansion;

generate a truncated single summation array from the infinite expansion by discarding one or more repeating sections of the array based upon a defined error bound; and synthesize the representation of the hardware logic multiplier using said truncated single summation array.

8. The non-transitory computer readable storage medium according to claim 7, wherein the hardware logic multiplier is a hardware logic implementation of an operation to multiply an input value by the predetermined invariant rational that satisfies the defined error bound.

9. A hardware logic multiplier configured to multiply an input value by a predetermined invariant rational that satisfies a defined error bound, wherein the hardware logic multiplier is synthesized using a process comprising:

truncating a binary expansion of the predetermined invariant rational;

converting the truncated binary expansion into canonical signed digit notation and expanding the canonical signed digit representation into a finite representation of an infinite expansion;

generating a truncated single summation array from the infinite expansion by discarding one or more repeating sections of the array based upon the defined error bound; and synthesizing the hardware logic multiplier using said truncated single summation array.

10. The hardware logic multiplier according to claim 9, wherein the process further comprises:

determining the binary expansion of the predetermined invariant rational.

11. The hardware logic multiplier according to claim 9, wherein generating a truncated single summation array from the infinite expansion by discarding one or more repeating sections of the array comprises:

determining a maximum binary value of a repeating section in a finite representation of an infinite single summation array generated from the infinite expansion;

weighting the maximum binary value by a weight of each section; and calculating a minimum number of whole repeating sections to be retained within the truncated single summation array to satisfy the defined error bound.

12. The hardware logic multiplier according to claim 11, wherein generating a truncated single summation array from the infinite expansion by discarding one or more repeating sections of the array further comprises:

identifying one or more bits from a retained whole repeating section that can be discarded from the truncated single summation array whilst satisfying the defined error bound.

13. The hardware logic multiplier according to claim 9, wherein the hardware logic multiplier is fabricated in silicon.

* * * * *